(12) United States Patent
Schloremberg et al.

(10) Patent No.: US 10,586,689 B2
(45) Date of Patent: Mar. 10, 2020

(54) SPUTTERING APPARATUS INCLUDING CATHODE WITH ROTATABLE TARGETS, AND RELATED METHODS

(75) Inventors: Marcel Schloremberg, Habay-la-Neuve (BE); Guy Comans, Neufchateau (BE); Philippe Uselding, Habay-la-Neuve (BE)

(73) Assignee: GUARDIAN EUROPE S.A.R.L., Bertrange (LU)

( * ) Notice: Subject to any disclaimer, the term of this patent is extended or adjusted under 35 U.S.C. 154(b) by 177 days.

(21) Appl. No.: 12/461,130

(22) Filed: Jul. 31, 2009

(65) Prior Publication Data

US 2011/0024284 A1 Feb. 3, 2011

(51) Int. Cl.
H01J 37/34 (2006.01)
C23C 14/35 (2006.01)
C23C 14/34 (2006.01)

(52) U.S. Cl.
CPC ........ H01J 37/342 (2013.01); C23C 14/3407 (2013.01); C23C 14/3442 (2013.01); C23C 14/3464 (2013.01); C23C 14/352 (2013.01); H01J 37/3417 (2013.01); H01J 37/3429 (2013.01); H01J 37/3432 (2013.01); H01J 37/3435 (2013.01)

(58) Field of Classification Search
CPC ............ C23C 14/3407; C23C 14/3464; C23C 14/3442; H01J 37/3435; H01J 37/3429; H01J 37/342; H01J 37/3417; H01J 37/3432
USPC ............ 204/298.12, 298.09, 298.23, 298.26, 204/298.28
See application file for complete search history.

(56) References Cited

U.S. PATENT DOCUMENTS

| | | | | |
|---|---|---|---|---|
| 3,616,451 | A | * | 10/1971 | Gallez ...................... 204/298.26 |
| 3,756,939 | A | * | 9/1973 | Hurwitt ............... C23C 14/3407 204/298.12 |
| 4,806,220 | A | | 2/1989 | Finley |
| 4,898,789 | A | | 2/1990 | Finley |
| 5,110,662 | A | | 5/1992 | Depauw et al. |
| 5,178,980 | A | | 1/1993 | Mort et al. |
| 5,248,564 | A | | 9/1993 | Ramesh |

(Continued)

FOREIGN PATENT DOCUMENTS

JP 05-171432 7/1993
WO WO 00/18979 4/2000

OTHER PUBLICATIONS

A. Belkind, Sputtering and Co-sputtering of Optical Coatings using a C-MAG™ Rotatable Cylindrical Cathode, 1991, Society of Vaccum Coaters, 505/298-7624.*

*Primary Examiner* — Rodney G McDonald

(57) ABSTRACT

Certain example embodiments relate to sputtering apparatuses that include a plurality of targets such that a first one or ones of target(s) may be used for sputtering in a first mode, while a second one or ones of target(s) may be used for sputtering in a second mode. Modes may be switched in certain example embodiments by rotating the position of the targets, e.g., such that one or more target(s) to be used protrude into the main chamber of the apparatus, while one or more target(s) to be unused are recessed into a body portion of a cathode of (e.g., integrally formed with) the sputtering apparatus. The targets may be cylindrical magnetic targets or planar targets. At least one target location also may be made to accommodate an ion beam source.

8 Claims, 3 Drawing Sheets

(56) References Cited

U.S. PATENT DOCUMENTS

| | | |
|---|---|---|
| 5,262,032 A | 11/1993 | Hartig et al. |
| 5,270,517 A | 12/1993 | Finley |
| 5,317,006 A | 5/1994 | Kumar |
| 5,403,458 A | 4/1995 | Hartig et al. |
| 5,527,439 A | 6/1996 | Sieck et al. |
| 5,557,462 A | 9/1996 | Hartig et al. |
| 5,591,314 A | 1/1997 | Morgan et al. |
| 5,688,585 A | 11/1997 | Lingle et al. |
| 5,821,001 A | 10/1998 | Arbab et al. |
| 5,922,176 A | 7/1999 | Caskey |
| 6,045,896 A | 4/2000 | Boire et al. |
| 6,090,481 A | 7/2000 | Depauw et al. |
| 6,287,685 B1 | 9/2001 | Guiselin et al. |
| 6,322,881 B1 | 11/2001 | Boire et al. |
| 6,328,858 B1 * | 12/2001 | Felsenthal et al. ...... 204/192.15 |
| 6,368,664 B1 | 4/2002 | Veerasamy et al. |
| 6,445,503 B1 | 9/2002 | Lingle |
| 6,524,688 B1 | 2/2003 | Eby et al. |
| 6,572,940 B1 | 6/2003 | Noethe et al. |
| 6,576,349 B2 | 6/2003 | Lingle et al. |
| 6,625,875 B2 | 9/2003 | Sol |
| 6,632,491 B1 | 10/2003 | Thomsen et al. |
| 6,686,050 B2 | 2/2004 | Lingle et al. |
| 6,740,211 B2 | 5/2004 | Thomsen et al. |
| 6,777,030 B2 | 8/2004 | Veerasamy et al. |
| 6,808,606 B2 | 10/2004 | Thomsen et al. |
| 7,049,003 B2 | 5/2006 | Thomsen et al. |
| 7,060,359 B2 | 6/2006 | Eby et al. |
| 7,150,916 B2 | 12/2006 | Lemmer et al. |
| 7,183,559 B2 | 2/2007 | Luten et al. |
| 7,198,699 B2 | 4/2007 | Thomsen et al. |
| 7,217,460 B2 | 5/2007 | Nunez-Regueiro |
| 7,229,533 B2 | 6/2007 | Veerasamy |
| 7,311,975 B2 | 12/2007 | Butz et al. |
| 7,344,782 B2 | 3/2008 | Lingle et al. |
| 7,405,411 B2 | 7/2008 | Walton |
| 7,462,397 B2 | 12/2008 | Lingle et al. |
| 7,488,951 B2 | 2/2009 | Murphy et al. |
| 7,521,096 B2 | 4/2009 | Lemmer et al. |
| 7,550,067 B2 | 6/2009 | Veerasamy |
| 7,563,347 B2 | 7/2009 | Kriltz et al. |
| 2002/0064662 A1 | 5/2002 | Lingle et al. |
| 2003/0085122 A1 * | 5/2003 | Takahashi ................ 204/298.23 |
| 2003/0150711 A1 | 8/2003 | Laird |
| 2004/0000168 A1 | 1/2004 | Vandal |
| 2004/0005467 A1 | 1/2004 | Neuman et al. |
| 2004/0063320 A1 * | 4/2004 | Hollars ........................ 438/689 |
| 2006/0249376 A1 * | 11/2006 | Walton ........................ 204/260 |
| 2007/0256933 A1 | 11/2007 | Yoon et al. |
| 2008/0017112 A1 | 1/2008 | Murphy |

\* cited by examiner

SPUTTERING APPARATUS INCLUDING CATHODE WITH ROTATABLE TARGETS, AND RELATED METHODS

FIELD OF THE INVENTION

Certain example embodiments of this invention relate to sputtering apparatuses. More particularly, certain example embodiments of this invention relate to sputtering apparatuses that include cathodes having rotatable targets. In certain example embodiments, a sputtering apparatus includes a plurality of targets such that a first one or ones of target(s) may be used for sputtering in a first mode, while a second one or ones of target(s) may be used for sputtering in a second mode. The sputtering apparatus may switch between modes by rotating the position of the targets, e.g., such that one or more target(s) to be used protrude into the main chamber of the apparatus, while one or more target(s) to be unused are recessed into a body portion of a cathode of (e.g., integrally formed with) the sputtering apparatus.

BACKGROUND AND SUMMARY OF EXAMPLE EMBODIMENTS OF THE INVENTION

The use of sputtering in order to deposit coatings on substrates is known in the art. For example, and without limitation, see U.S. Pat. Nos. 5,922,176; 5,403,458; 5,317,006; 5,527,439; 5,591,314; 5,262,032; and 5,284,564, the entire contents of each of which are hereby incorporated herein by reference. Briefly, sputter coating is a thin film coating process that involves the transport of almost any material from a target to a substrate of almost any other material. The ejection of the target material is accomplished by bombarding the surface of the target with gas ions accelerated by a high voltage. Particles are ejected from the target as a result of momentum transfer between the accelerated gas ions and the target. Upon ejection, the target particles traverse the sputtering chamber and are subsequently deposited on a substrate as a thin film.

Sputtering processes typically utilize an enclosed chamber confining a sputtering gas, a target electrically connected to a cathode, a substrate, and a chamber which itself may serve as the electrical anode. A power supply typically is connected such that the negative terminal of the power supply is connected to the cathode and the positive terminal is connected to the chamber walls. In operation, a sputtering gas plasma is formed and maintained within the chamber near the surface of the sputtering target. By electrically connecting the target to the cathode of the sputtering power supply and creating a negative surface charge on the target, electrons are emitted from the target. These electrons collide with atoms of the sputtering gas, thereby stripping away electrons from the gas molecules and creating positively charged ions. The resulting collection of positively charged ions together with electrons and neutral atoms is referred to generally as a sputtering gas plasma. The positively charged ions are accelerated toward the target material by the electrical potential between the sputtering gas plasma and the target and bombard the surface of the target material. As ions bombard the target, molecules of target material are ejected from the target surface and coat the substrate.

One known technique for enhancing conventional sputtering processes involves arranging magnets behind or near the target to influence the path taken by electrons within the sputtering chamber, thereby increasing the frequency of collisions with sputtering gas atoms or molecules. Additional collisions create additional ions, thus further sustaining the sputtering gas plasma. An apparatus utilizing this enhanced form of sputtering by means of strategically located magnets generally is referred to as a magnetron system.

Conventional sputtering apparatuses work well when depositing one or two thin film layers, as some single-chamber designs are configured to deposit the same. Unfortunately, however, conventional sputtering techniques suffer from several disadvantages. As layer stacks become more complex, e.g., at least in requiring multiple layers in a single layer stack, conventional sputtering apparatuses encounter difficulties. For example, one must typically determine how best to use one's existing equipment in depositing more complicated layer stacks, or at least layer stacks with more layers.

One possible solution to such difficulties involves providing additional sputtering chambers. Separate sputtering apparatuses may even be supplied. However, as more chambers are added to a single sputtering apparatus, or as more individual sputtering apparatuses are added to a fabrication facility, additional space is required. In addition to requiring more space, which in some instances may be at a premium, the equipment costs also can be prohibitively high, particularly when the added equipment may not be necessary for all layer stacks being produced at a given facility.

Another possible solution to such difficulties involves temporarily halting the assembly line, removing a target in a sputtering chamber, and restarting the assembly line. However, this solution may require the sputtering chamber to be vented (e.g., in the event that an inert gas is being used in connection therewith), cooled (e.g., as sputtering typically takes place at several hundred degrees Celsius), pressurized (e.g., as sputtering typically is performed in an at least partial vacuum), etc. Because these wait times are imposed, yield is reduced, as people and intermediate products are simply "waiting around" during these configuration and reconfiguration processes. Production speeds may be significantly decreased because of the waiting involved in such processes.

The above and/or other problems may be exacerbated when a plurality of different materials to be deposited using different kinds of targets are requirement. For example, it may not always be possible to switch from a planar target of a first material to a cylindrical target of a second material, or even a cylindrical target of the same first material. Needless to say, it may become even more difficult to selectively incorporate an ion beam in such sputtering apparatuses.

Thus, it will be appreciated that there is a need in the art for improved sputtering apparatuses and/or methods. For example, it will be appreciated that there is a need in the art for improved sputtering apparatuses that are selectively reconfigurable and/or methods associated with the same.

In certain example embodiments of this invention, a sputtering apparatus for sputter coating an article in a reactive environment is provided. The sputtering apparatus includes a vacuum chamber. A cathode has a hollow body portion. A substantially planar yoke is provided between the cathode and chamber, with the yoke including at least first and second target locations provided on a first major surface thereof, and at least third and fourth target locations provided on a second major surface thereof. The at least first and second target locations at least initially face the vacuum chamber, and the at least third and fourth target locations at least initially face the cathode. The yoke is rotatable such that, upon a rotation, the at least third and fourth target locations face the vacuum chamber and the at least first and second target locations face the cathode. Upon a further rotation, the at least first and second target locations face the vacuum chamber, and the at least third and fourth target locations face the cathode.

In certain example embodiments of this invention, a sputtering apparatus for sputter coating an article in a reactive environment is provided. At least one power source is provided. A vacuum chamber is provided. A cathode has a hollow body portion. A yoke is provided between the cathode and chamber, with the yoke including at least one target location provided on each major surface thereof. A plurality of sputtering targets is provided, with each sputtering target being provided to one of the target locations. Each sputtering target provided on the major surface of the yoke closest the vacuum chamber protrudes into the vacuum chamber, while any other sputtering target(s) is/are recessed in the body portion of the cathode. The yoke is rotatable about an axis such that a rotation thereof causes at least one different sputtering target to protrude into the vacuum chamber. Only the sputtering target(s) protruding into the vacuum chamber receive power from the at least on power source.

In certain example embodiments of this invention, a method of sputter coating a plurality of articles is provided. A sputtering apparatus is provided, with the sputtering apparatus comprising: at least one power source; a vacuum chamber; a cathode having a hollow body portion; and a yoke provided between the cathode and chamber, the yoke including at least one target location provided on each major surface thereof; and a plurality of sputtering targets, each said sputtering target being provided to one said target location. Each sputtering target provided on the major surface of the yoke closest the vacuum chamber protrudes into the vacuum chamber, while any other sputtering target(s) is/are recessed in the body portion of the cathode. The yoke is rotatable about an axis such that a rotation thereof causes at least one different sputtering target to protrude into the vacuum chamber. Only the sputtering target(s) protruding into the vacuum chamber receive power from the at least on power source. At least one said target location is configured to accommodate an ion beam source in place of a sputtering target. A first article is provided to the sputtering apparatus. A first thin film is sputter deposited, directly or indirectly, on the first article. The yoke is rotated. A second article is provided to the sputtering apparatus. A second thin film is sputter deposited, directly or indirectly, on the first article, with the second thin film being different from the first thin film at least in terms of composition.

In certain example embodiments of this invention, a sputtering apparatus for sputter coating an article in a reactive environment is provided. The sputtering apparatus comprises at least one power source, a vacuum chamber; and a cathode having a hollow body portion. A plurality of yokes are provided between the cathode and chamber, with each said yoke including at least one target location provided on each major surface thereof. A plurality of sputtering targets are provided, with each said sputtering target being provided to one said target location. Each sputtering target provided on the major surfaces of the yokes closest the vacuum chamber protrudes into the vacuum chamber, while any other sputtering target(s) is/are recessed in the body portion of the cathode. The yokes are rotatable about an axis such that a rotation thereof causes at least one different sputtering target to protrude into the vacuum chamber. Only the sputtering target(s) protruding into the vacuum chamber receive power from the at least on power source. According to certain example embodiments, the yokes may be individually rotatable.

The features, aspects, advantages, and example embodiments described herein may be combined to realize yet further embodiments.

BRIEF DESCRIPTION OF THE DRAWINGS

These and other features and advantages will be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments relate to sputtering apparatuses that include a plurality of targets such that a first one or ones of target(s) may be used for sputtering in a first mode, while a second one or ones of target(s) may be used for sputtering in a second mode. Modes may be switched in certain example embodiments by rotating the position of the targets, e.g., such that one or more target(s) to be used protrude into the main chamber of the apparatus, while one or more target(s) to be unused are recessed into a body portion of a cathode of (e.g., integrally formed with) the sputtering apparatus.

Figure 1:
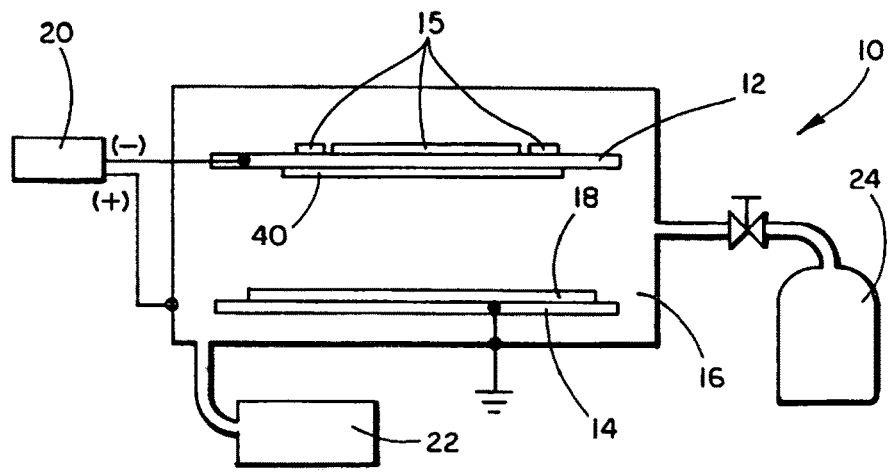
FIG. 1 is a simplified schematic illustration of a conventional reactive DC magnetron sputtering apparatus and target.
Figure 2:
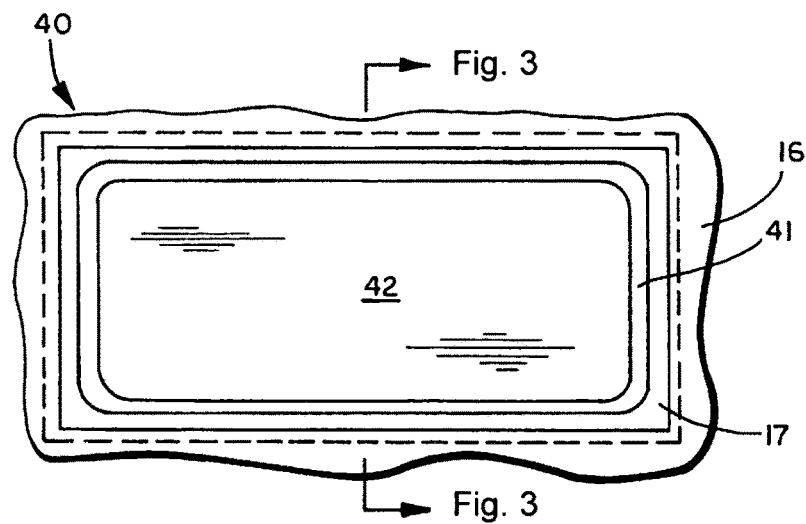
FIG. 2 is a top plan view of a conventional, planar sputtering target.
Figure 3:
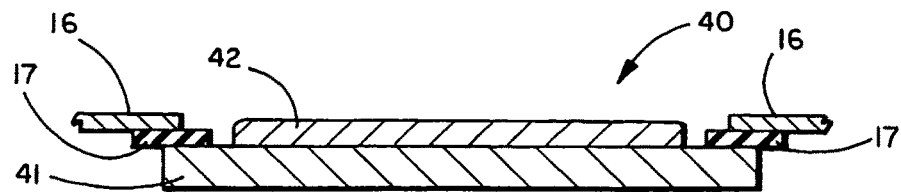
FIG. 3 is a cross section of the sputtering target of FIG. 2.

Referring now more particularly to the accompanying drawings in which like reference numerals indicate like parts throughout the several views, FIG. 1 is a simplified schematic illustration of a conventional reactive DC magnetron sputtering apparatus and target. Apparatus 10 typically includes a sputtering chamber 16, a vacuum means 22 to evacuate the chamber, a sputtering target such as a planar target 40 (as illustrated in FIGS. 2-3, for example), one or more magnets 15, a supply of sputtering gas 24, a power supply 20 having a positive terminal and a negative terminal, and means 14 to support and/or transport the substrate in the deposition region of the chamber. The target typically is electrically connected to cathode 12. Cathode 12 typically is electrically connected to the negative terminal of power supply 20. The sputtering chamber 16 itself sometimes is the electrical anode. Alternately, a separate anode element may be included inside the sputtering chamber and may be connected to its own power supply so as to be at some set potential other than ground with respect to cathode 12.

Typically, the sputtering chamber 16 is at ground potential and, in some example instances, the sputtering chamber 16 may be connected to the positive terminal of the power supply. Usually, the target is at the most negative potential of any of the components of the sputtering apparatus (besides the negative terminal of the power supply). It will be appreciated that various electrical connections may be made between the power supply 20 and the various components of the sputtering apparatus 10.

Once the sputtering chamber 16 has been evacuated to the desired vacuum level by vacuum means 22, a sputtering gas 24 is introduced into chamber 16. In certain example sputtering processes, the sputtering gas 24 may be an inert gas such as argon, neon, etc. Other forms of sputtering processes known as reactive sputtering may use reactive non-inert gases such as oxygen or nitrogen. In addition, some sputtering operations may utilize a mixture of one or more inert gases and/or non-inert gases.

The sputtering target provides the material which is to be deposited onto the substrate. The size, shape, and construction of the target may vary depending upon the material and the size and shape of the substrate. A typical planar sputtering target 40 before sputtering is shown in FIGS. 2-3. The planar sputtering target 40 comprises an electrically conducting backing plate 41 and a layer of electrically conducting target material 42 deposited thereon. An electrical insulator 17 may be employed to cover any exposed region of backing member 41 or other underlying surface. Typically, the chamber walls 16 will abut insulator 17 and extend up to, but not contact, the target material 42. Backing member 41 is not necessary for all target materials (e.g., such as those that are inherently rigid or of sufficient thickness). Thus, in such instances, the target material itself may also serve as the backing member.

Figure 4:
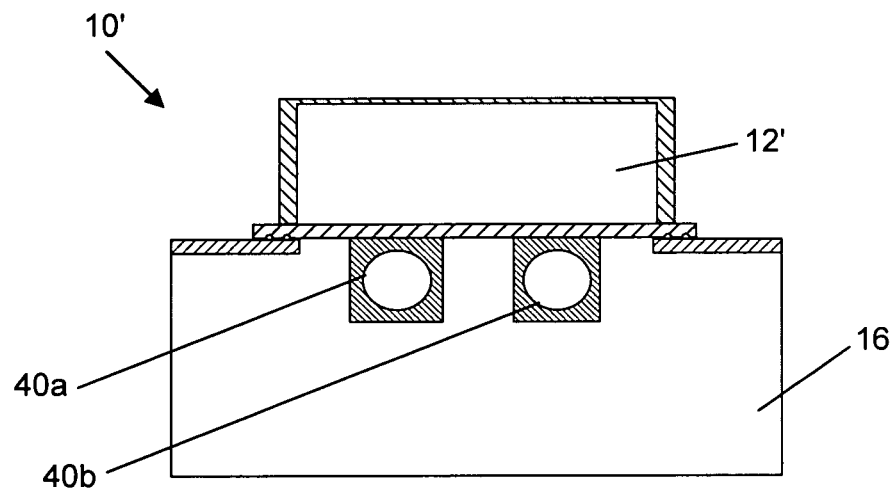
FIG. 4 is a cross section of a dual cylindrical magnetic (dual C-MAG) sputtering apparatus.

FIG. 4 is a cross section of a dual cylindrical magnetic (also sometimes called a dual C-MAG) sputtering apparatus 10'. The dual C-MAG sputtering apparatus 10' includes first and second rotatable magnet targets 40a and 40b. In the FIG. 4 example, the first and second targets 40a and 40b hang into the chamber 16 from the cathode assembly 12'. In operation, a flux of material emanates from each of the two rotating magnetic from the first and second rotating targets 40a and 40b down through the chamber 16 and onto a substrate (not shown) passing therethrough. One mixed layer, two separate layers, etc., may be deposited on a substrate using this arrangement.

Certain example embodiments relate to sputtering apparatuses that include a plurality of targets such that a first one or ones of target(s) may be used for sputtering in a first mode, while a second one or ones of target(s) may be used for sputtering in a second mode. Modes may be switched in certain example embodiments by rotating the position of the targets, e.g., such that one or more target(s) to be used protrude into the main chamber of the apparatus, while one or more target(s) to be unused are recessed into a body portion of a cathode of (e.g., integrally formed with) the sputtering apparatus. Because the targets rotate at least partially within the body portion of the cathode, the cathode assemblies of certain example embodiments are sometimes referred to herein as "revolver cathodes." As explained in greater detail below, the ability to rotate targets to active and inactive positions within the sputtering apparatus enables a number of example advantages to be realized. For instance, in certain example embodiments, the type of target material in a chamber may be changed without venting the chamber, different types of targets may be used within a single apparatus, etc.

Figure 5:
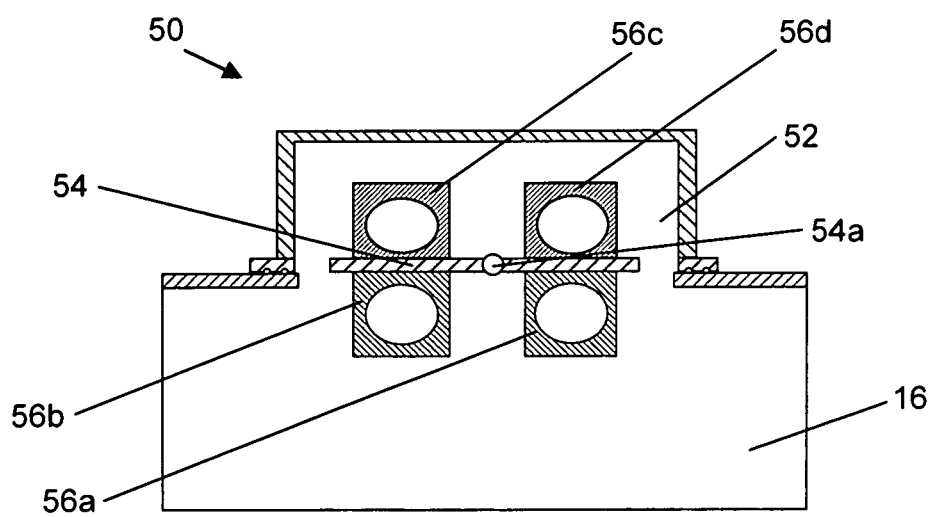
FIG. 5 is a cross section of an improved sputtering apparatus having a revolver cathode and four cylindrical magnetic targets in accordance with certain example embodiments.

FIG. 5 is a cross section of an improved sputtering apparatus 50 having a revolver cathode 52 and four cylindrical magnetic targets in accordance with certain example embodiments. The improved sputtering apparatus 50 of FIG. 5 is similar to the sputtering apparatus 10' of FIG. 4 in that, in both first, two cylindrical magnetic targets protrude into the sputtering chamber from a cathode assembly. However, unlike the FIG. 4 sputtering apparatus 10', the improved sputtering apparatus 50 of FIG. 5 includes a revolver cathode 52 and four cylindrical magnetic targets 56a-d. In particular, in FIG. 5, two cylindrical targets in active positions 56a and 56b protrude into the sputtering chamber 16, while two additional cylindrical targets in inactive positions 56c and 56d are recessed in the revolver cathode 52.

As can be seen in FIG. 4, the cathode 12' thereof has a bottom surface adjacent to the top surface of the sputtering chamber 16 which essentially separates the interior of the cathode 12' from the interior of the sputtering chamber 16. Unlike this arrangement, the revolver cathode 52 in FIG. 5 does not have a bottom surface that separates the interior of the revolver cathode 52 from the interior of the sputtering chamber 16. Instead, a target revolver yoke 54 is provided in place of this bottom surface. This target revolver yoke 54 holds all of the targets, e.g., first and second cylindrical targets in active positions 56a and 56b and third and fourth cylindrical targets in inactive positions 56c and 56d.

In certain example embodiments, the target revolver yoke 54 may not fully (or even substantially fully) isolate the interior of the revolver cathode 52 from the interior of the chamber 16. That is, in certain example embodiments, there may be a gap between one or more edge(s) of the yoke 54 and the side walls of the revolver cathode 54. However, in certain example embodiments, the target revolver yoke 54 may fully or substantially fully isolate the interior of the revolver cathode 52 from the interior of the chamber 16, essentially taking the place of the bottom surface of the cathode 12' in FIG. 4.

The materials in the active targets and inactive targets may be the same or different from one another. That is, the active targets may be of a first material and the inactive targets may be of a second material, one active target may be the same as one inactive target, etc. Any target material may be used for any of the four locations, depending on the desired coating or application.

Figure 6A:
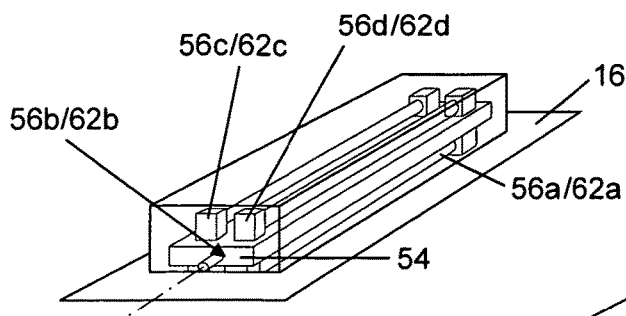
FIGS. 6a-6c illustrate targets being rotated within the revolver cathode of FIG. 5 in accordance with certain example embodiments.
Figure 6B:
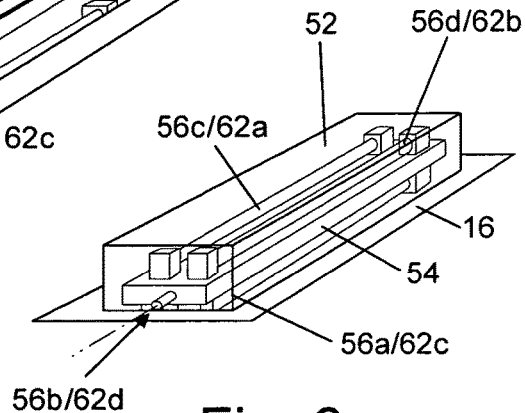
Figure 6C:
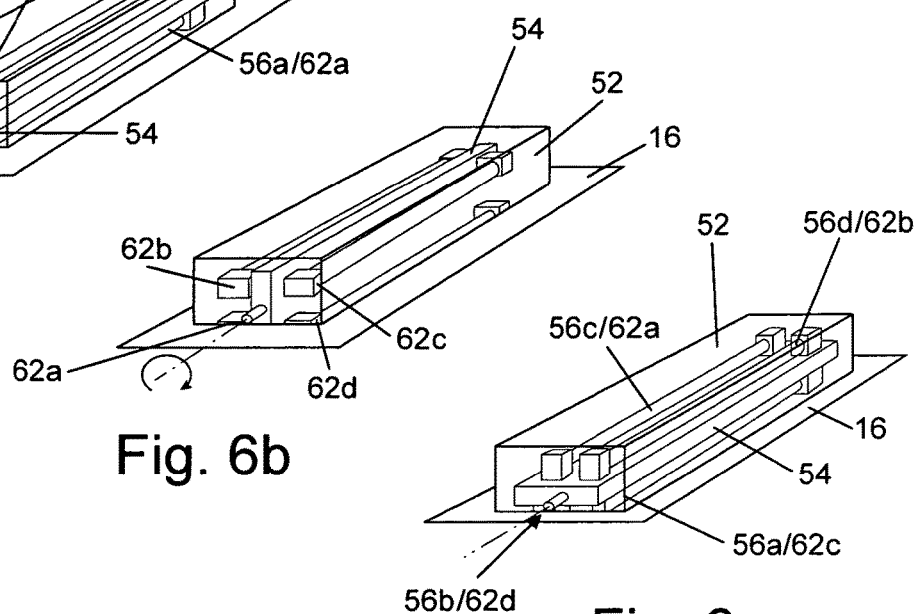

The targets may be moved from active-to-inactive and inactive-to-active positions when the yoke is rotated, e.g., about an axis 54a in the approximate center thereof. In this regard, FIGS. 6a-6c illustrate targets being rotated within the revolver cathode of FIG. 5 in accordance with certain example embodiments. FIG. 6a shows the targets being configured for a first mode of use. Thus, first and second targets 62a and 62b are provided at first and second active positions 56a and 56b, while third and fourth targets 62c and 62d are provided at first and second inactive positions 56c and 56d. Production may be started in this first mode. Cooling fluid (e.g., water) may flow into all target tubes, both in the active and inactive positions, e.g., to reduce the likelihood of the damage or corruption to any of the target material. However, in power is provided only to those target tubes in the active positions 56a and 56b.

When the production is to be changed (e.g., to accommodate a new layer in a given layer stack; to begin work on a different product; to replace a damaged, destroyed, or used target, etc.), the sputtering process may be temporarily suspended. At this time, the yoke 54 may be rotated, e.g., about its axis 54a. FIG. 6b shows the locations of the target tubes after a 90 degree clockwise rotation, and FIG. 6c shows the locations of the target tubes after another 90 degree clockwise rotation (for a total 180 degree rotation). Following this rotation, the previously unused targets 62c and 62d are now located in active positions 56a and 56b, while the previously used targets 62a and 62b are now in inactive positions 56c and 56d. Power is now provided to the targets 62c and 62d that are located in the active positions 56a and 56b, all four targets receiving cooling fluids, and sputtering may be restarted in the second mode. The rotation may be performed manually and/or by machine in example embodiments of this invention. Rotation may be in the counterclockwise direction in certain example embodiments.

In certain example embodiments, power may be supplied to the targets by means of respective connectors located on the cathode and on the targets that are configured to engage with one another when in the active position. Upon partial rotation, the connectors may lose contact, thus disconnecting the targets from the power source. Alternatively, or in addition, in certain example embodiments, all tubes may be switched, such that only those tubes in the active locations are "turned on."

In certain example embodiments, one or more external hatches may be provided so that the targets in the inactive positions may be removed, inspected, replaced, etc. In certain example embodiments, the yoke 54 may be made of a 300 series stainless steel. The magnetic permeability (as measured by relative permeability or pr) of 300 series stainless steel ranges from about 1.00-8.48, with an average magnetic permeability of about 1.27, as derived from 181 of the different grades of 300 series stainless steel. Accordingly, because 300 series stainless steel has low or substantially no magnetic permeability, it has little interference with the magnetic field generated during sputtering. In certain example embodiments, 304 series stainless steel may be used.

Although certain example embodiments have been described as including two sets (active and inactive) of C-MAG targets, other configurations are possible in connection with certain example embodiments. In this regard, FIGS. 7 and 8, described in detail below, show two further example configurations. In any event, each target location may have a cylindrical magnetic target, a planar target, or an ion beam. Ion beam milling has been described independently and in connection with sputtering apparatuses, for example, in U.S. Pat. Nos. 6,368,664; 6,740,211; 6,777,030; 6,808,606; 7,049,003; 7,183,559; 7,198,699; 7,229,533; 7,311,975; 7,405,411; 7,488,951; and 7,550,067, and U.S. Publication Nos. 2008/0017112; 2006/0008657; and 2004/0020761, each incorporated herein by reference in its entirety. Thus, where two target locations are provided for each of the active and inactive sides, it is possible to have embodiments including dual C-MAG targets, dual planar targets, one cylindrical and one planar target, one cylindrical target and an ion beam, or one planar target and an ion beam. In certain example embodiments, the size of the opening may be adjusted so as to accommodate planar targets (including the rotation thereof), as planar targets tend to be larger than cylindrical targets in a widthwise direction.

Figure 7:
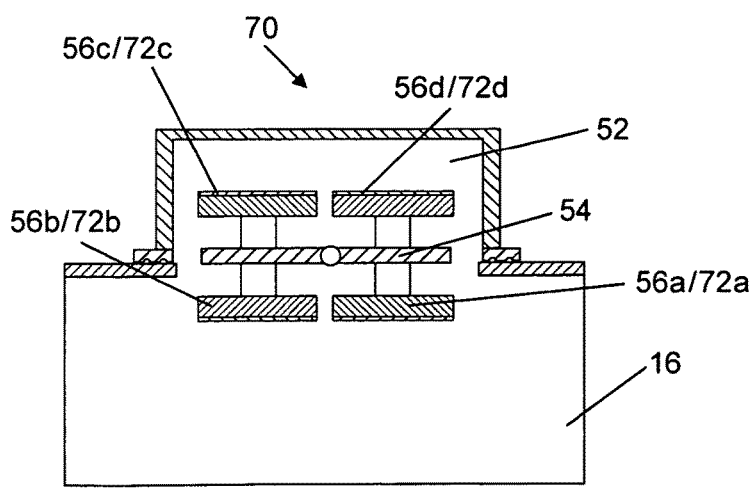
FIG. 7 is a cross section of an improved sputtering apparatus having a revolver cathode and four planar targets in accordance with certain example embodiments.

FIG. 7 is a cross section of an improved sputtering apparatus 70 having a revolver cathode and four planar targets 72a-d in accordance with certain example embodiments. Thus, first and second planar targets 72a and 72b are provided in active locations 56a and 56b, while third and fourth planar targets 72c and 72d are provided in inactive locations 56c and 56d. These targets may be rotated as described above.

Figure 8:
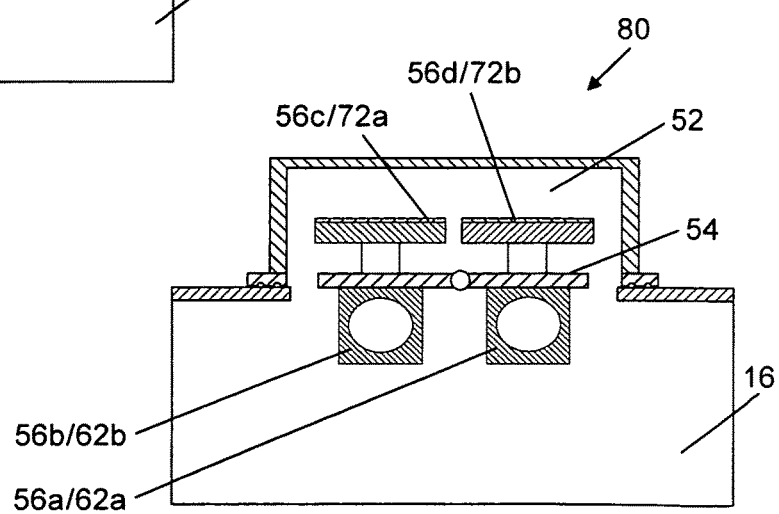
FIG. 8 is a cross section of an improved sputtering apparatus having a revolver cathode and two planar targets and two cylindrical magnetic targets in accordance with certain example embodiments.

FIG. 8 is a cross section of an improved sputtering apparatus 80 having a revolver cathode and two planar targets 72a and 72b and two cylindrical magnetic targets 62a and 62b in accordance with certain example embodiments. The first and second planar targets 72a and 72b are provided in inactive locations 56c and 56d, while the first and second cylindrical magnetic targets 62a and 62b are provided in the active locations 62a and 62b. Of course, the targets may be rotated as described above, such that the first and second planar targets 72a and 72b moved to the active locations and the first and second cylindrical magnetic targets 62a and 62b are moved to the inactive locations.

Although certain example embodiments have been described in connection with a yoke having two active and two passive locations, other configurations are possible. For example, a yoke may in certain example embodiments support one active location on a first side and one inactive location on a second side, one location on the first side and two locations on the second side, etc. Additionally or alternative, although certain example embodiments have been described in connection with a substantially planar yoke, other yoke shapes also are possible. For example, a substantially triangular yoke may be provided so as to accommodate targets and/or ion beams on each of the three sides, with each side being differently or similarly configurable. Of course, other shapes, such as squares, rectangles, and the like also are possible, generally if one side thereof extends into the chamber and is configured to receive power while the others are moved out into the body portion of a suitably sized revolver cathode. Of course, the amount of rotation needed to changing from an inactive to active position may change according to the shape of the yoke. For example, for a triangle, a 60 degree rotation may be used to change from a first inactive position to the active position, and a 120 degree rotation may be used to change from a second inactive position to the active position.

As indicated above, multiple targets may be provided to one or more sides of a single yoke. This may be used to provide, for example, ion beam assisted dual planar cathode arrangements. However, in certain example embodiments, multiple yokes also may be provided. In such further example embodiments, the yokes may be rotatable substantially independent of one another. Thus, following the example above, a first yoke may be provided to select a first planar target, a second yoke may be provided to select a second planar target, a third yoke may be provided to select an ion beam. Still further, in certain example embodiments, a target location on a yoke may be left empty, e.g., so that the location essentially can be turned off. In still further example embodiments, some targets or other devices may be provided at a fixed position remote from the yoke. For example, in the ion beam assisted dual planar target example above, the ion beam may be in a fixed location remote from the yoke.

As alluded to above, the improved sputtering apparatuses of certain example embodiments may enable the coater target configuration to be easily changed. For example, the types of targets, target materials, etc., may be changed by simple rotation of a yoke. Such changes may be made without needing to vent the chamber in certain example embodiments. For instance, in certain example embodiments, the selective reconfiguration techniques may enable the sputtering apparatus to switch between single silver to double or triple silver based antireflective coatings. Similar to as described above, in certain example embodiments, the chamber may be held at a pressure less than atmospheric and/or at an elevated temperature during such configuration changes. These features also may reduce the need for further chambers and/or sputtering apparatuses in certain designs. Fewer chambers and/or fewer apparatuses may, in turn, lead to cost savings in terms of equipment being saved, fewer power supplies/less power being used, time savings during reconfiguration, etc. Indeed, in certain example embodiments, the time savings may increase the production yields of coaters. Although the processing conditions may vary in actual implementations, the coater may generally operate at a pressure of about 10-3 mbars, and the atmospheric pressure generally may be about 1030 mbars.

While a particular layer or coating may be said to be "on" or "supported by" a surface or another coating (directly or indirectly), other layer(s) and/or coatings may be provided therebetween. Thus, for example, a coating may be considered "on" and "supported by" a surface even if other layer(s) are provided between layer(s) and the substrate. Moreover, certain layers or coatings may be removed in certain embodiments, while others may be added in other embodiments of this invention without departing from the overall spirit of certain embodiments of this invention. Thus, by way of example, an encapsulating coating applied in liquid sol-gel form in accordance with an example embodiment may be said to be "on" or "supported by" a sputtering target material, even though other coatings and/or layers may be provided between the sol-gel formed coating and the target material.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A sputtering apparatus for sputter coating an article in a reactive environment, comprising:
   a sputtering vacuum chamber;
   first, second, third, and fourth rotatable sputtering targets comprising first, second, third, and fourth respective cathodes;
   a substantially planar rotatable yoke supporting said first, second, third, and fourth rotatable sputtering targets, the yoke including at least first and second target locations provided on a first major surface thereof, and at least third and fourth target locations provided on a second major surface thereof, wherein the first and second rotatable sputtering targets are supported at the first and second target locations on the first major surface of the yoke and the third and fourth rotatable sputtering targets are supported at the third and fourth target locations on the second major surface of the yoke, so that the first and second targets are on one side of the yoke and the third and fourth targets are on the other side of the yoke;
   wherein the first and second targets are planar targets;
   wherein the first and second major surfaces are opposing major surfaces of the same substantially planar rotatable yoke, the at least first and second target locations are configured to be located inside the vacuum chamber and facing the vacuum chamber when the yoke is in a first position, wherein the at least third and fourth target locations are configured to be located on the second major surface of the yoke facing away from the sputtering vacuum chamber when the yoke is in the first position, so that when the yoke is in the first position the first and second planar targets are in the sputtering vacuum chamber, are parallel to a substrate onto which a coating is to be sputtered, and are active for sputtering and the third and fourth targets are facing away from the sputtering vacuum chamber and located in a recess adjacent to but outside an upper portion of the sputtering vacuum chamber and are inactive for sputtering, the recess being defined in part by sidewalls that extend upwardly from the upper portion of the sputtering vacuum chamber so as to accommodate the yoke and the third and fourth targets when the yoke is in the first position, the yoke being interposed between an upper portion of the recess and the substrate that is to be coated;
   wherein when the first and second targets are at the first and second target locations, respectively, all targets supported by the yoke are either (a) directly facing the substrate that is to be coated or (b) facing directly away from the substrate, so that when the first and second targets are at the first and second target locations respectively no target supported by the yoke is angled relative to the substrate;
   wherein the yoke is rotatable such that, upon a rotation of the yoke from the first position to a second position, when the yoke is rotated from the first position to the second position the first and second targets move out of the sputtering vacuum chamber and into the recess and the third and fourth targets move out of the recess and into the sputtering vacuum chamber, so that when the yoke is in the second position the third and fourth sputtering targets are facing the sputtering vacuum chamber and the first and second targets are facing away from the sputtering vacuum chamber;
   wherein a rotational axis of the yoke is parallel to planes defined by the first and second targets and is parallel to and located in the recess;
   wherein when the yoke is in the first position cooling fluid flows through each of the first, second, third, and fourth targets, but a power source is connected to the first and second targets but not the third and fourth targets; and
   wherein when the yoke is in the second position cooling fluid flows through each of the first, second, third, and fourth targets, but the power source is connected to the third and fourth targets but not the first and second targets.

2. The sputtering apparatus of claim 1, wherein cylindrical magnetic targets are provided to the third and fourth target locations.

3. The sputtering apparatus of claim 1, wherein planar targets are provided to the third and fourth target locations.

4. The sputtering apparatus of claim 1, wherein planar targets are provided to each of said target locations.

5. The sputtering apparatus of claim 1, further comprising an ion beam source located in at least one said target location.

6. The sputtering apparatus of claim 1, further comprising a power source connectable to each said sputtering target when each said sputtering target faces the vacuum chamber.

7. The sputtering apparatus of claim 1, further comprising a cooling fluid source, fluid from said cooling fluid source being flowable through each said sputtering target.

8. The sputtering apparatus of claim 1, wherein at least one said target location is configured to accommodate an ion beam source in place of a sputtering target.

* * * * *